United States Patent
Hayashi (10) Patent No.: US 8,975,940 B2
(45) Date of Patent: Mar. 10, 2015

(54) SEMICONDUCTOR DEVICE

(71) Applicant: Renesas Electronics Corporation, Kanagawa (JP)

(72) Inventor: Yutaka Hayashi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/893,436

(22) Filed: May 14, 2013

(65) Prior Publication Data
US 2013/0328610 A1    Dec. 12, 2013

(30) Foreign Application Priority Data
May 31, 2012    (JP) .................................. 2012-124110

(51) Int. Cl.
*H03L 5/00*    (2006.01)
*H03K 3/013*    (2006.01)
*H03K 17/081*    (2006.01)

(52) U.S. Cl.
CPC .......... *H03K 3/013* (2013.01); *H03K 17/08104* (2013.01)
USPC ........................................ 327/321; 327/308

(58) Field of Classification Search
USPC .................. 327/306, 309, 321, 308, 310–314
See application file for complete search history.

(56) References Cited

U.S. PATENT DOCUMENTS

| 6,087,877 A * | 7/2000 | Gonda et al. ................. 327/309 |
| 7,532,445 B2 * | 5/2009 | Rana et al. ..................... 361/56 |
| 8,254,070 B2 * | 8/2012 | Arndt et al. .................... 361/56 |

FOREIGN PATENT DOCUMENTS

JP    2008-035067 A    2/2008

* cited by examiner

*Primary Examiner* — Dinh Le
(74) *Attorney, Agent, or Firm* — Mattingly & Malur, P.C.

(57) ABSTRACT

The semiconductor device includes a power transistor that is disposed between a first signal line, which is coupled to a first external terminal, and a second signal line, which is coupled to a second external terminal. A gate electrode of the power transistor is coupled to a third signal line. The semiconductor device further includes a clamp circuit that clamps a voltage between the first signal line and the third signal line, a first resistive element that is disposed between the third signal line and the second signal line, and a monitoring section that monitors a voltage between the third signal line and the second signal line. The clamp circuit is configured so that a clamp voltage can be changed. The monitoring section exercises control to decrease the clamp voltage when the voltage between the third signal line and the second signal line exceeds a predefined threshold value.

14 Claims, 9 Drawing Sheets

SEMICONDUCTOR DEVICE

CROSS-REFERENCE TO RELATED APPLICATIONS

The disclosure of Japanese Patent Application No. 2012-124110 filed on May 31, 2012 including the specification, drawings, and abstract is incorporated herein by reference in its entirety.

BACKGROUND

The present invention relates to a semiconductor device that is expected to withstand high voltage, and more particularly to an effective technology applicable to a semiconductor device having a high-voltage transistor at its output stage.

A load drive circuit mounted in an automotive ECU (Electrical Control Unit) and other semiconductor device that is expected to withstand high voltage is expected to exhibit high noise immunity. For example, a low-side driver having a power transistor for driving an airbag ignition device (squib) in an automobile airbag system is expected to operate normally at a voltage not higher than an absolute maximum rated voltage (e.g., approximately 30 V). If such a low-side driver operates at a voltage higher than the absolute maximum rated voltage, it is necessary to provide protection so that, for example, the power transistor does not break down or malfunction. For example, the above-mentioned low-side driver is coupled to the squib through a harness (signal wire). However, induced current noise may be applied to the harness coupled to the low-side driver due to mutual inductance between the harness and another harness existing in an automobile so that a voltage higher than an element's breakdown voltage is applied to the output terminal of the low-side driver. As such being the case, a built-in mechanism for coupling an external protection device, such as a capacitor or a zener diode, to the output terminal of the low-side driver and performing an operation (active clamp operation) for allowing the low-side driver to absorb the current noise is incorporated to prevent the power transistor from breaking down or malfunctioning due, for instance, to the induced current noise. More specifically, an active clamp circuit is disposed between the gate and drain of a power transistor at an output stage, as disclosed in Japanese Unexamined Patent Application Publication No. 2008-35067, so that when a voltage higher than the absolute maximum rated voltage is applied to the output terminal due to the application of significant induced current noise, the induced current noise is absorbed by raising the gate voltage of the power transistor to turn on the power transistor. Further, the external protection device coupled to the output terminal absorbs current-noise energy exceeding the absorption capacity of the power transistor to prevent the voltage at the output terminal from exceeding the breakdown voltage of the power transistor.

During an active clamp operation, the voltage at the output terminal of the low-side driver is determined by the voltage VGS between the gate and source of the power transistor and by the clamp voltage of the clamp circuit and increases with an increase in a drain current. When the voltage at the output terminal of the low-side driver reaches the breakdown voltage Bvds of the power transistor, the power transistor breaks down. Further, as electrical power increases with an increase in the time of application of current noise, the breakdown voltage decreases with a decrease in the current capacity of the power transistor (with a decrease in the transistor size). Therefore, the power transistor needs to be designed while considering the above-mentioned characteristics.

SUMMARY

The low-side driver should not allow the power transistor to turn on unintentionally while the voltage at the output terminal is not higher than the absolute maximum rated voltage. Therefore, the active clamp operation should start within a voltage range within which the voltage at the output terminal of the low-side driver (the drain-source voltage VDS of the power transistor) is not lower than the absolute maximum rated voltage and is lower than the breakdown voltage Bvds of the power transistor. Hence, the clamp voltage of the clamp circuit needs to be determined in such a manner that a voltage at which the active clamp operation starts is within the above-mentioned voltage range. When a circuit configuration described in Japanese Unexamined Patent Application Publication No. 2008-35067 is employed, the gate-source voltage developed at a predetermined drain-source voltage VDS decreases with an increase in the clamp voltage. To increase the current absorption capacity of the power transistor during the active clamp operation, therefore, it is necessary to increase the transistor size of the power transistor. It means that the cost of a chip increases. An alternative method of enhancing the noise immunity of the low-side driver is to increase the current absorption capacity of the external protection device. However, when such an alternative method is employed, it is necessary to increase the size of an external capacitor coupled to the output terminal and additionally couple the output terminal to a zener diode suitable for a breakdown voltage and ampere capacity. It also entails a cost increase. The above-described problem concerning noise immunity and cost increase is also a problem for an ESD protection element of a semiconductor device that is expected to withstand high voltage.

Means for solving the above problem will be described below. Other problems and novel features will become apparent from the following description and from the accompanying drawings.

A representative aspect of the present invention disclosed in this document is summarized below.

According to the representative aspect of the present invention, there is provided a semiconductor device including a power transistor, a clamp circuit, a first resistive element, and a monitoring section. The power transistor is disposed between a first signal line coupled to a first external terminal and a second signal line coupled to a second external terminal. A gate electrode of the power transistor is coupled to a third signal line. The clamp circuit clamps a voltage between the first signal line and the third signal line. The first resistive element is disposed between the third signal line and the second signal line. The monitoring section monitors a voltage between the third signal line and the second signal line. The clamp circuit is configured so that a clamp voltage can be changed. The monitoring section exercises control to decrease the clamp voltage when the voltage between the third signal line and the second signal line exceeds a predefined threshold value.

An advantage provided by the representative aspect of the present invention disclosed in this document is summarized below.

The noise immunity of a semiconductor device can be enhanced while suppressing a cost increase.

BRIEF DESCRIPTION OF THE DRAWINGS

Embodiments of the present invention will be described in detail based on the following figures, in which.

DETAILED DESCRIPTION

1. Overview of a Representative Embodiment

First of all, an embodiment representative of the present invention disclosed in this document will be summarized. The parenthesized reference numerals in the accompanying drawings referred to in the overview of the representative embodiment merely illustrate what is contained in the concept of elements to which the reference numerals are affixed.

[1] (A Semiconductor Device that Decreases a Clamp Voltage During Active Clamping in Accordance with the Gate Voltage of a Power Transistor)

A semiconductor device (10 (20)) according to the representative embodiment of the present invention includes a first signal line (L_LD (L_HD)) coupled to a first external terminal (LDD, (HDD, VREG, VCC)), a second signal line (L_LS (L_LGND)) coupled to a second external terminal (LDS (GND, VSS)), and a third signal line (L_LG (L_EG)). The semiconductor device also includes a power transistor (DMNL (DMNE)) that is disposed between the first signal line and the second signal line. A gate electrode of the power transistor is coupled to the third signal line. The semiconductor device further includes a clamp circuit (144), a first resistive element (R1), and a monitoring section (143). The clamp circuit is disposed between the first signal line and the third signal line to clamp a voltage between the first signal line and the third signal line. The first resistive element is disposed between the third signal line and the second signal line. The monitoring section monitors a gate voltage of the power transistor. The clamp circuit is configured so that a clamp voltage can be changed. The monitoring section exercises control to decrease the clamp voltage of the clamp circuit when the gate voltage exceeds a predefined threshold value.

Consequently, the gate voltage of the power transistor can be raised after the start of an active clamp operation. Hence, the current absorption capacity of the power transistor can be increased during the active clamp operation. This makes it possible to enhance the noise immunity of the semiconductor device without increasing the transistor size of the power transistor or enlarging an external capacitor or other external protection device coupled to the first external terminal.

[2] (Decreasing the Clamp Voltage by Forming a Current Path in Parallel with a Certain Diode)

In the semiconductor device described under [1], the clamp circuit includes a plurality of series-coupled diodes (ZD1-ZD5). The monitoring section decreases the clamp voltage of the clamp circuit by forming a current path in parallel with one (ZD1) or more of the diodes.

Consequently, control can be easily exercised to decrease the clamp voltage.

[3] (Controlling a Switch Disposed Across the One or More of the Diodes)

In the semiconductor device described under [2], the clamp circuit further includes a switch element (DMP1) coupled across the one or more of the diodes. The monitoring section forms the current path by turning on the switch element.

Consequently, the current path can be easily formed in parallel with the one or more of the diodes.

[4] (Zener Diode)

In the semiconductor device described under any one of [1] to [3], the diodes include a zener diode.

[5] (Configuration of a Gate Voltage Detection Circuit)

In the semiconductor device described under [3] or [4], the monitoring section includes a first transistor (DMN1) and a voltage generation section (146). A gate electrode of the first transistor (DMN1) is coupled to the third signal line. The voltage generation section is coupled at one end to a source electrode of the first transistor and coupled at the other end to the second signal line to generate a voltage across both ends thereof in accordance with an input current. The monitoring section further includes a load element (R3). One end of the load element is disposed between a drain electrode of the first transistor and the first signal line. An on/off operation of the switch element is controlled in accordance with the potential difference across the load element.

Consequently, the on/off operation of the switch element can be easily controlled. Further, the above-described configuration determines the predefined threshold value in accordance with the voltage generated by the voltage generation section. Hence, the predefined threshold value can be easily adjusted.

[6] (A Low-Side Driver and a Detection Transistor are the Same Type of Transistor.)

In the semiconductor device described under [5], the power transistor and the first transistor are the same type of transistor (DMOS).

Consequently, the power transistor and the first transistor have the same characteristics in terms, for instance, of variations and temperature changes. Hence, the predefined threshold value can be easily adjusted.

[7] (DMOS)

In the semiconductor device described under any one of [1] to [6], the power transistor is a DMOS transistor.

[8] (Gate Drive Circuit: Low-Side Driver)

The semiconductor device (140) described under any one of [1] to [8] further includes a drive voltage generation section (141) that outputs a drive voltage for driving the power transistor to the third signal line in accordance with a control signal (SL) for specifying whether to turn on or off the power transistor.

Consequently, high noise immunity can be implemented in a driver circuit (e.g., low-side driver) that handles the power transistor as a load drive element.

[9] (Absolute Maximum Rating)

In the semiconductor device described under [8], the monitoring section, the monitoring section exercises control to decrease the clamp voltage of the clamp circuit by switching the clamp voltage from a first voltage (VCLMP1) to a second voltage (VCLMP2), which is lower than the first voltage. The second voltage is adjusted so that the voltage developed between the first signal line and the second signal line after switching is higher than the absolute maximum rating of the power transistor.

Consequently, it is possible to not only ensure the operation of the semiconductor device at a voltage not higher than the absolute maximum rated voltage, but also increase the current absorption capacity during the active clamp operation.

[10] (A Low-Side Driver that Provides Overvoltage Detection)

The semiconductor device described under [8] or [9] further includes an overvoltage detection section (142) that activates a detection signal (SD) when the voltage between the first signal line and the second signal line is found to be higher than a predetermined voltage. When the detection signal is activated, the drive voltage generation section stops the output of the drive voltage.

Consequently, even during a control state in which the power transistor is driven by the drive voltage, it can be stopped to properly switch to the active clamp operation.

[11] (Control Section: Load Drive Device)

The semiconductor device described under any one of [8] to

[10] Further Includes a Control Section (15) that Generates the Control Signal in Accordance with a Signal Input from the Outside.

[12] (ESD Protection Element Between Power Supplies)

In the semiconductor device (16, 16_2) described under any one of [1] to [7], the first external terminal is a power supply terminal (HDD, VCC) that receives the supply of a first power supply voltage (VDDH), whereas the second external terminal is a power supply terminal (GND, VSS) that receives the supply of a second power supply voltage (ground voltage), which is lower than the first power supply voltage.

Consequently, enhanced ESD immunity can be implemented for an ESD protection element between the power supply terminals.

[13] (ESD Protection Element for I/O Terminals)

In the semiconductor device (16_1) described under any one of [1] to [7], the first external terminal is a signal terminal (VREG) that inputs or outputs a signal, whereas the second external terminal is a power supply terminal (VSS) that receives the supply of a power supply voltage (ground voltage), which is lower than a voltage supplied to the signal terminal.

Consequently, enhanced ESD immunity can be implemented for an ESD protection element between the signal terminal and the power supply terminal.

2. Details of Preferred Embodiments

Embodiments of the present invention will now be described in further detail.

First Embodiment

Figure 1:
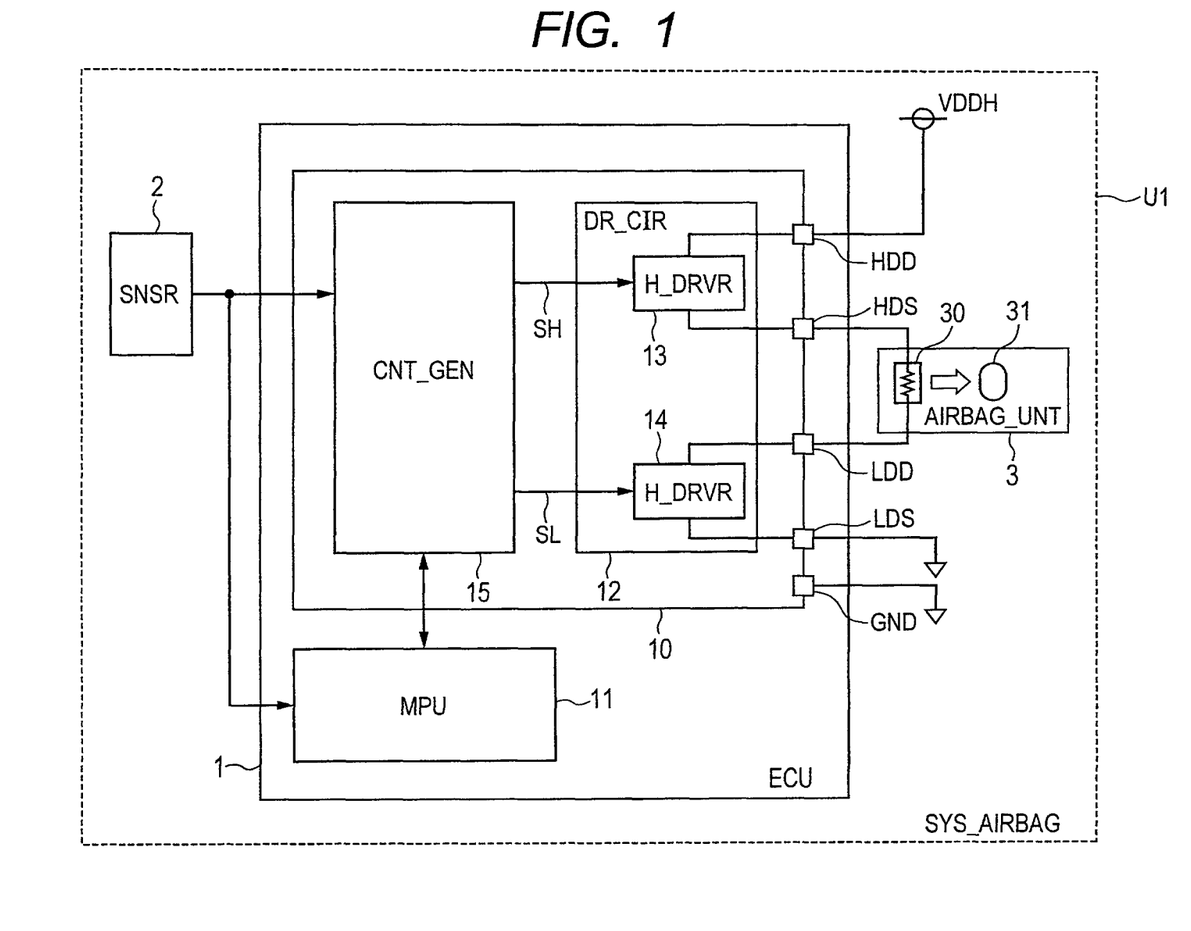
FIG. 1 is a block diagram illustrating a semiconductor device according to an embodiment of the present invention.

FIG. 1 is a block diagram illustrating a semiconductor device according to a first embodiment of the present invention. A system U1 shown in FIG. 1 is a part of, for instance, an automobile control system and is an airbag control system that controls the operations, for instance, of an airbag for a driver's seat of an automobile and an airbag for a passenger seat.

The airbag control system (SYS_AIRBAG) U1 includes, for example, an ECU (electronic control unit) 1, a sensor section (SNSR) 2, and an airbag unit (AIRBAG_UNT) 3. The sensor section 2 is a group of sensors, such as a trigger sensor for detecting an impact to a vehicle and an acceleration sensor. A detection signal output from the sensor section 2 is not particularly limited, but is input to the ECU 1 through a filter circuit (not shown) or the like. The airbag unit 3 includes, for example, an airbag 31 and an ignition device (squib) 30 for deploying the airbag.

The ECU 1 is a control device that controls the operation of the airbag unit 3 upon receipt of a detection signal from the sensor section 2. The ECU 1 is, for example, a semiconductor device that includes a microcontroller (MPU) 11 and a squib driver circuit 10. The microcontroller 11 and the squib driver circuit 10 are not particularly limited, but formed in separate semiconductor chips. For example, the microcontroller 11 is a semiconductor integrated circuit that is formed over a semiconductor substrate, such as monocrystalline silicon, by a well-known CMOS integrated circuit manufacturing technology, whereas the squib driver circuit 10 is a semiconductor integrated circuit that is formed over a semiconductor substrate, such as monocrystalline silicon, by a well-known BiC-DMOS process manufacturing technology.

The microcontroller 11 performs various arithmetic processes in accordance with a detection signal output from the sensor section 2, generates a control signal in accordance with the results of arithmetic processing, and outputs the control signal. The squib driver circuit 10 inputs the control signal output from the microcontroller 11 and the detection signal output from the sensor section 2, and controls the operation of the airbag unit 3. More specifically, the squib driver circuit 10 deploys the airbag 31 by allowing a current to flow to the squib 30 in the airbag unit 3 in accordance with the control signal from the microcontroller 11 and with the detection signal from the sensor section 2.

The squib driver circuit 10 includes, for example, a control signal generation section (CNT_GEN) 15, a driver section (DR_CIR) 12, and a plurality of external coupling terminals. In FIG. 1, a terminal HDD, a terminal HDS, a terminal LDD, a terminal LDS, and a terminal GND are representatively shown as the external coupling terminals.

The driver section 12 includes, for example, a high-side driver circuit (H_DRVR) 13 and a low-side driver circuit (L_DRVR) 14. The high-side driver circuit 13 is a driver circuit that forms a current path between a squib ignition power supply VDDH and a high (Hi)-side terminal of the squib 30. The low-side driver circuit 14 is a driver circuit that forms a current path between a low (Lo)-side terminal of the squib 30 and a ground potential (ground node). The control signal generation section 15 generates and outputs a control signal SH for controlling the high-side driver circuit 13 and a control signal SL for controlling the low-side driver circuit 14 in accordance with the control signal from the microcontroller 11 and with the detection signal from the sensor section 2.

Figure 2:
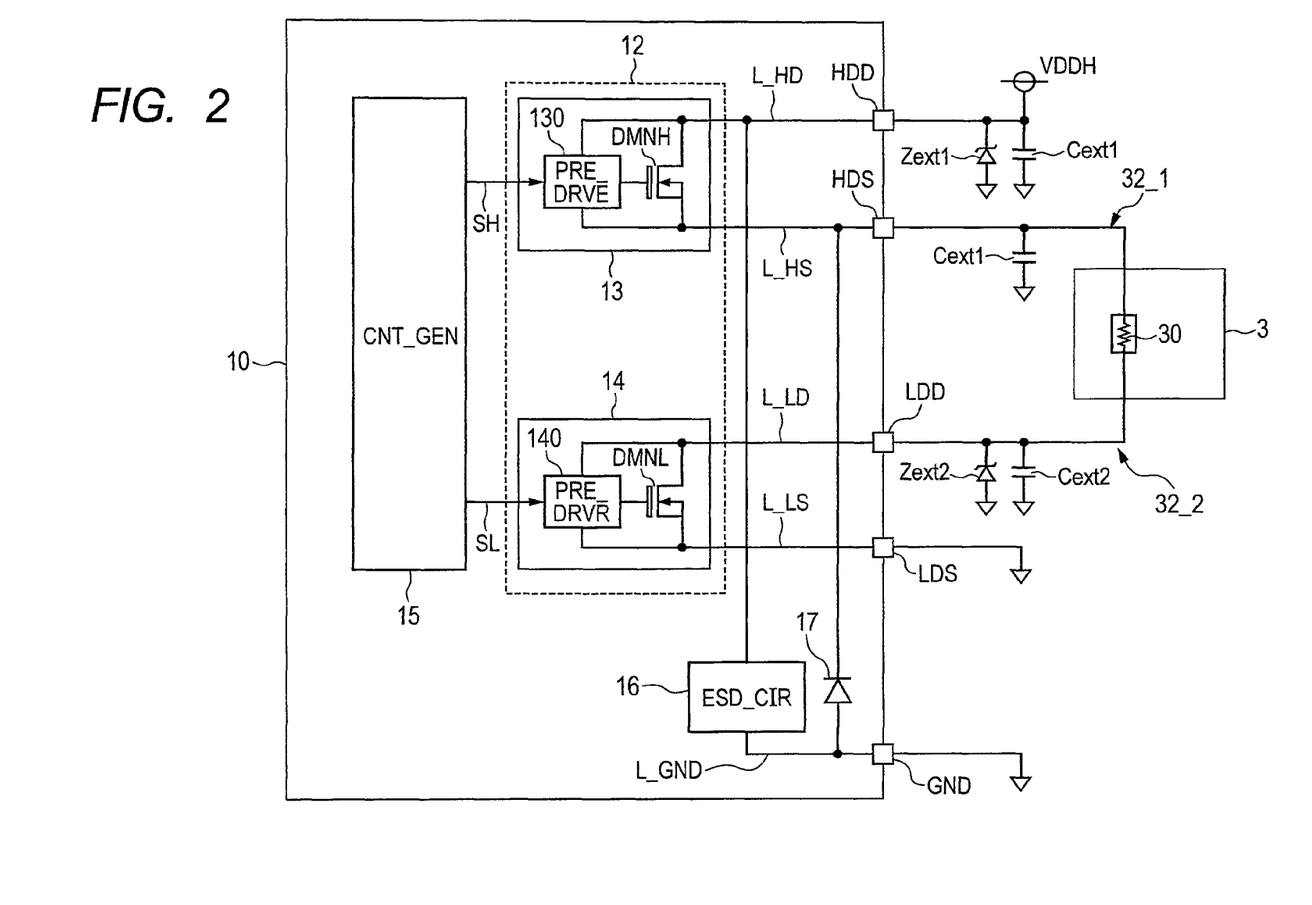
FIG. 2 is a diagram illustrating in detail a coupling scheme of the output stage of a squib driver circuit.

FIG. 2 is a diagram illustrating in detail a coupling scheme of the output stage of the squib driver circuit 10.

The internal coupling scheme of the squib driver circuit 10 is described below.

The terminal HDD is coupled to a signal line L_HD. The terminal HDS is coupled to a signal line L_HS. The terminal LDD is coupled to a signal line L_LD. The terminal LDS is coupled to a signal line L_LS. The terminal GND is coupled to a signal line L_LGND. An ESD protection circuit (ESD_CIR) 16 is coupled between the signal line L_HD and the signal line L_LGND. An ESD protection diode 17 is coupled between the signal line L_HS and the signal line L_LGND.

The low-side driver circuit 14 is coupled between the signal line L_LD and the signal line L_LS. The low-side driver circuit 14 includes, for example, a power transistor DMNL at an output stage and a pre-driver circuit 140 for driving the power transistor DMNL. The power transistor DMNL at the output stage is, for example, a DMOS (Double-Diffused MOSFET) transistor, which is a high-voltage transistor. A drain of the power transistor DMNL is coupled to the signal line L_LD, and a source thereof is coupled to the signal line L_LS. The pre-driver circuit 140 generates a drive voltage in accordance with the control signal SL output from the control signal generation section 15 and supplies the generated drive voltage to a gate of the power transistor DMNL for the purpose of controlling the on/off operation of the power transistor DMNL.

The high-side driver circuit 13 is coupled between the signal line L_HD and the signal line L_HS. The high-side driver circuit 13 includes, for example, a power transistor DMNH at an output stage and a pre-driver circuit 130 for driving the power transistor DMNH. The power transistor DMNH at the output stage is, for example, a high-voltage DMOS transistor, as is the case with the power transistor DMNL in the low-side driver circuit 14. A drain of the power transistor DMNH is coupled to the signal line L_HD and a source thereof is coupled to the signal line L_HS. The pre-driver circuit 130 generates a drive voltage in accordance with the control signal SH output from the control signal generation section 15 and supplies the generated drive voltage to a gate of the power transistor DMNH for the purpose of controlling the on/off operation of the power transistor DMNH.

The external coupling scheme of the squib driver circuit 10 is described below.

The terminal HDD is coupled to the squib ignition power supply VDDH through a signal line. The squib ignition power supply VDDH is not particularly limited, but supplies a voltage of approximately 23 V. The terminal HDD is also coupled to external protection devices for noise absorption, such as an external capacitor Cext1 and an external zener diode Zext1. The terminal HDS is coupled to one end of the squib 30 through a harness 32_1. The terminal HDS is also coupled to an external protection device for noise absorption, such as an external capacitor Cext3. The terminal LDD is coupled to the other end of the squib 30 through a harness 32_2. The terminal LDD is also coupled to external protection devices for noise absorption, such as an external capacitor Cext2 and an external zener diode Zext2. The terminal LDS is coupled to the ground node through a signal line. Similarly, the terminal GND is also coupled to the ground node through a signal line.

As described above, the squib driver circuit 10 is electrically coupled to the squib 30 through the harnesses 21_1, 32_2. As mentioned earlier, a plurality of other harnesses exist in the automobile. Therefore, if a harness having a significant noise component exists near the harnesses 32_1, 32_2 coupled to the squib driver circuit 10, significant induced current noise may be applied to the harnesses 32_1, 32_2 due to mutual inductance between the harnesses. If, in a situation where such induced current noise is applied, a current path capable of allowing an induced current to flow does not exist or the impedance of the current path is high, a voltage higher than an element's breakdown voltage of the squib driver circuit 10 may be applied between the terminals of the squib driver circuit 10 to break the squib driver circuit 10 or degrade the characteristics thereof. As such being the case, the current noise is absorbed by incorporating the ESD protection circuit 16 and the ESD protection diode 17 into the squib driver circuit 10 as described above and by causing the low-side driver circuit 14 to perform a current noise absorption operation (active clamp operation).

Figure 3:
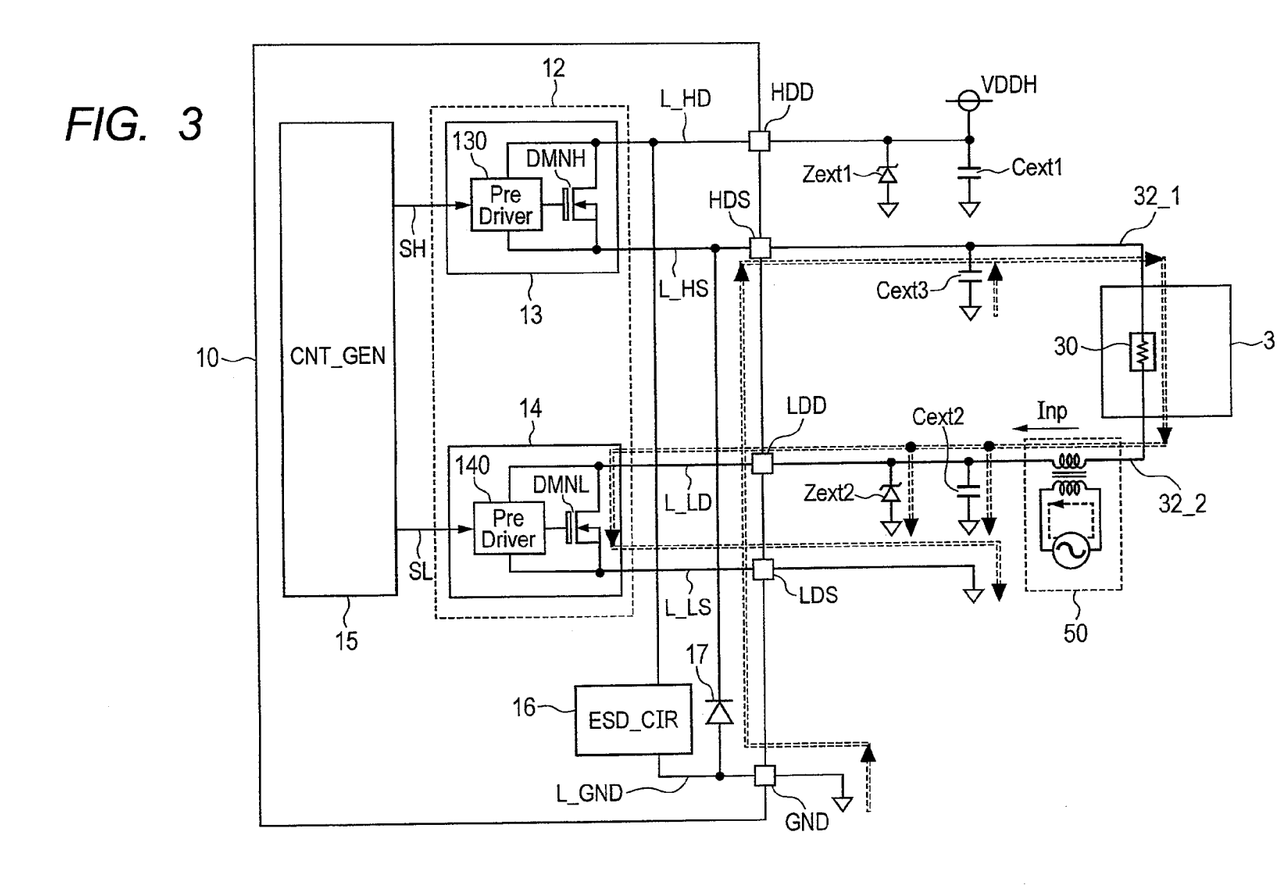
FIG. 3 is a diagram illustrating a current path that is followed when induced current noise is applied through a harness.

FIG. 3 is a diagram illustrating a current path that is followed when induced current noise is applied through a harness. FIG. 3 shows a case where a positive induced current Inp is applied to the terminal LDD, which serves as an output terminal of the low-side driver circuit 14. FIG. 3 also schematically shows a noise source 50 that acts as a mechanism for generating the induced current Inp, which is caused by the mutual inductance between harnesses.

As shown in FIG. 3, when the positive induced current Inp is applied to the terminal LDD, a current output from the terminal HDS through the grounded terminal GND and the EST protection diode 17 is combined with a current supplied from the external protection device (external capacitor Cext3). The resulting current Inp is then input into the squib 30. Part of the current flowing through the squib 30 is absorbed by the external protection devices (external capacitor Cext2 and external zener diode Zext2), whereas the remaining current is input to the terminal LDD. The current input to the terminal LDD flows into the power transistor DMNL due to the active clamp operation of the low-side driver circuit 14 and is absorbed by the ground node through the terminal LDS. This prevents a voltage higher than an element's breakdown voltage from being applied between the terminals (mainly between the terminal LDD and the terminal LDS) of the squib driver circuit 10. The low-side driver circuit 14, which performs the active clamp operation, will be described in detail below.

Figure 4:
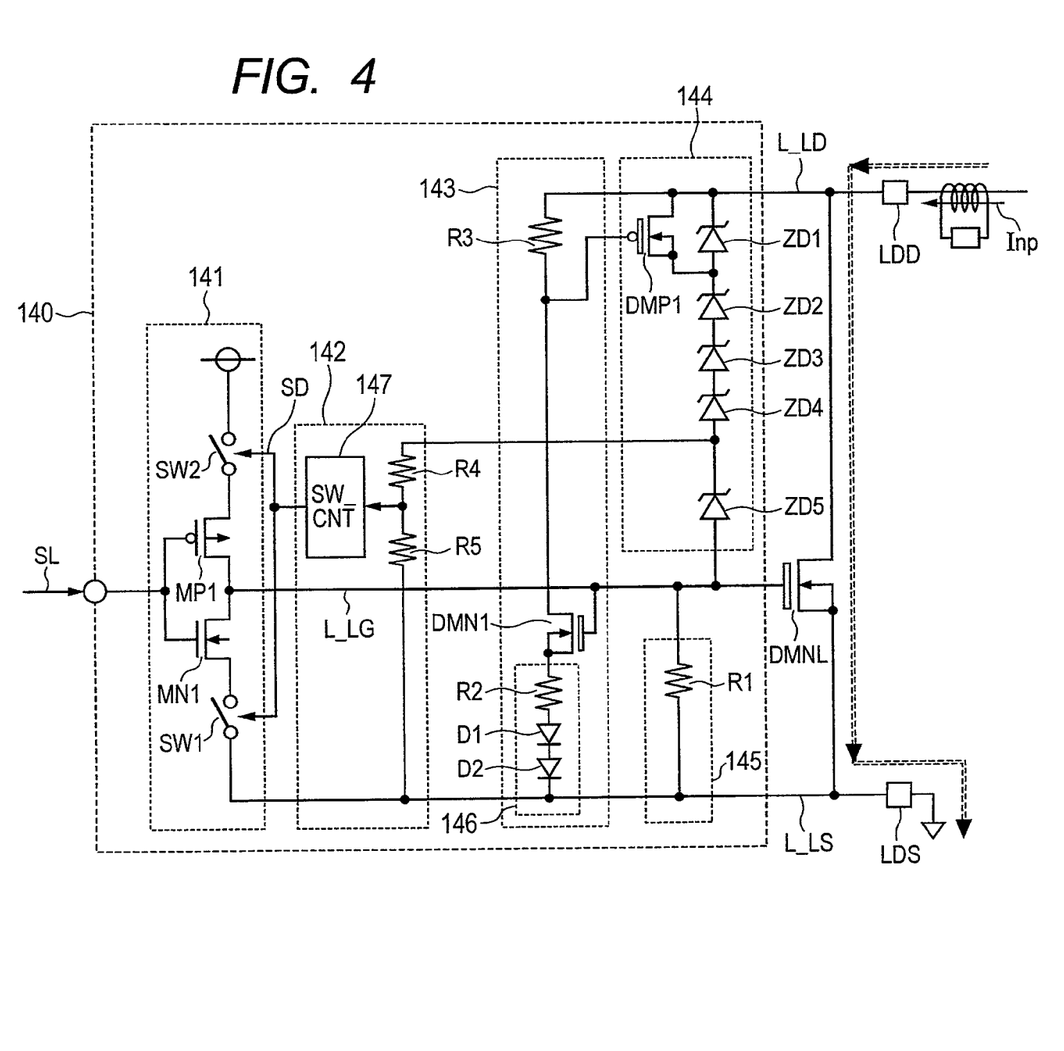
FIG. 4 is a circuit diagram illustrating the internal configuration of a low-side driver circuit.

FIG. 4 is a circuit diagram illustrating the internal configuration of the low-side driver circuit 14.

As described earlier, the low-side driver circuit 14 includes the power transistor DMNL, which is at the output stage, and the pre-driver circuit 140. As shown in FIG. 4, the pre-driver circuit 140 includes, for example, a gate drive circuit 141, an overvoltage detection circuit 142, a gate voltage monitoring circuit 143, a clamp circuit 144, and a pull-down circuit 145.

The gate drive circuit 141 generates a gate drive voltage in accordance with the control signal SL output from the control signal generation section 15 and supplies the gate drive voltage to a gate terminal of the power transistor DMNL. Specifically, the gate drive circuit 141 includes, for example, a p-channel MOS transistor MP1, an n-channel MOS transistor MN1, and switch elements SW1, SW2. One end of the switch element SW2 is coupled to a node to which a power supply voltage is supplied, and the other end is coupled to a source of the MOS transistor MP1. One end of the switch element SW1 is coupled to the ground node, and the other end is coupled to a source of the MOS transistor MN1. A gate of the MOS transistor MN1 is commonly coupled to a gate of the MOS transistor MP1 to receive the control signal SL. A drain of the MOS transistor MN1 and a drain of the MOS transistor MP1 are commonly coupled to a signal line L_LG. When, for instance, the switch elements SW1, SW2 are on, the gate drive circuit 141 supplies the gate drive voltage according to the logic value of the control signal SL to the signal line L_LG. On the other hand, when the switch elements SW1, SW2 are off, the output of the gate drive circuit 141 is in a high-impedance state so that the gate drive voltage is not supplied to the signal line L_LG. Although details will be given later, the switch elements SW1, SW2 turn on or off depending on whether a detection signal SD output from the overvoltage detection circuit 142 is active or inactive.

The pull-down circuit 145 is coupled between the gate and source of the power transistor DMNL and capable of discharging an electrical charge from the gate. The pull-down circuit 145 includes, for example, a resistive element R1 coupled between the signal line L_LG and the signal line L_LS, and statically turns off the power transistor DMNL even when electrical power or the control signal SL is not supplied to the low-side driver circuit 14.

The clamp circuit 144 clamps the voltage between the signal line L_LD and the signal line L_LG (the drain-gate voltage of the power transistor DMNL). The clamp circuit 144 includes, for example, a plurality of zener diodes ZD1-ZDn (n is 2 or greater integer) series-coupled between the drain and gate of the power transistor DMNL and a p-type DMOS transistor DMP1. The number of series-coupled zener diodes ZD1-ZDn can be adjusted in accordance with the value of the clamp voltage to be set. FIG. 4 illustrates a case where five zener diodes ZD1-ZD5 are series-coupled.

The clamp circuit 144 is configured so that the clamp voltage can be changed. More specifically, the clamp voltage is adjusted by forming a current path in parallel with some of the zener diodes ZD1-ZD5. When, for instance, the transistor DMP1 turns on while it is parallel-coupled to the zener diode ZD1, the clamp voltage of the clamp circuit 144 changes from a voltage VCLMP1 determined by the zener voltage of five zener diodes ZD1-ZD5 to a voltage VCLMP2 (<VCLMP1) determined by the zener voltage of four zener diodes ZD2-ZD5. The transistor DMP1 is not particularly limited, but is a p-type DMOS transistor.

The overvoltage detection circuit 142 monitors the voltage between the signal line L_LD and the signal line L_LS (the voltage at the terminal LDD) through the clamp circuit 144. When the voltage exceeds a detection threshold voltage VDT, the overvoltage detection circuit 142 activates the detection signal SD to stop the gate drive voltage output of the gate drive circuit 141. Specifically, the overvoltage detection circuit 142 includes voltage detection resistive elements R4, R5 and a switch control circuit 147. For example, one end of the resistive element R4 is coupled to a node to which the zener diodes ZD1-ZD5 in the clamp circuit 144 are series-coupled. FIG. 4 illustrates a case where one end of the resistive element R4 is coupled to a node to which the zener diodes ZD4, ZD5 are coupled. The other end of the resistive element R4 is coupled to one end of the resistive element R5. The other end of the resistive element R5 is coupled to the signal line L_LS (ground node). In accordance with the voltage of a node coupled to the resistive elements R4, R5, the switch control circuit 147 determines whether the detection threshold voltage VDT is exceeded by the voltage at the terminal LDD. In accordance with the result of determination, the switch control circuit 147 controls the on/off operations of the switch elements SW1, SW2. If, for instance, it is determined that the detection threshold voltage VDT is not exceeded by the voltage at the terminal LDD, the switch control circuit 147 deactivates the detection signal SD to turn on the switch elements SW1, SW2. If, on the other hand, it is determined that the detection threshold voltage VDT is exceeded by the voltage at the terminal LDD, the switch control circuit 147 activates the detection signal SD to turn off the switch elements SW1, SW2. Therefore, even when the power transistor DMNL is driven by the gate drive circuit 141, the drive can be stopped to properly let the power transistor DMNL switch to the active clamp operation.

The detection threshold voltage VDT for overvoltage detection is determined in consideration of the characteristics of a breakdown voltage Bvds of the power transistor DMNL and of an absolute maximum rated voltage Avds of the power transistor DMNL.

Figure 5:
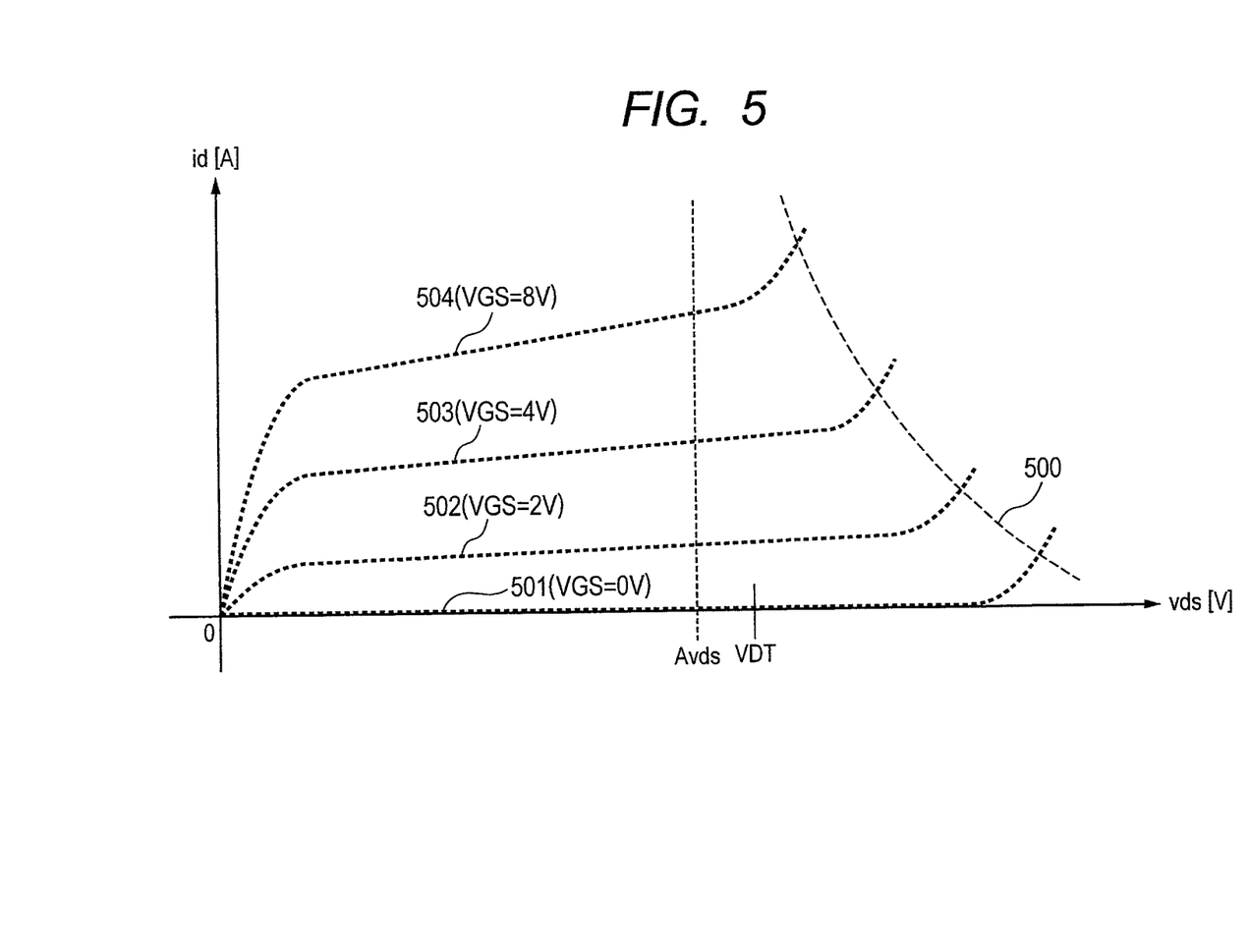
FIG. 5 is a diagram illustrating the relationship between a breakdown voltage Bvds, an absolute maximum rated voltage Avds, and an overvoltage-related detection threshold voltage VDT.

FIG. 5 is a diagram illustrating the relationship between the breakdown voltage Bvds and absolute maximum rated voltage Avds of the power transistor DMNL and the overvoltage-related detection threshold voltage VDT. FIG. 5 illustrates Id-Vds characteristics 501-504 when the gate-source voltage VGS of the power transistor DMNL is 0 V, 2 V, 4 V, and 8 V. Further, the characteristics of the breakdown voltage between the drain and source of the power transistor DMNL are designated by the reference numeral 500. FIG. 5 also shows the absolute maximum rated voltage Avds between the drain and source of the power transistor DMNL and the overvoltage-related detection threshold voltage VDT.

As indicated by the reference numeral 500 in FIG. 5, the breakdown voltage Bvds of the power transistor DMNL varies with the gate-source voltage VGS. More specifically, the breakdown voltage Bvds of the power transistor DMNL decreases with an increase in a gate voltage. The reason is that breakdown is facilitated when a drain current id increases due to a parasitic NPN operating before a drain-source voltage vds reaches a true breakdown voltage.

To ensure the operation of the squib driver circuit 10, it is essential that the active clamp operation do not start within a voltage range lower than the absolute maximum rated voltage Avds. Therefore, the overvoltage-related detection threshold voltage VDT (clamp voltage), which determines the start of the active clamp operation of the low-side driver circuit 14, is set to be higher than the absolute maximum rated voltage Avds. Further, as the active clamp operation needs to start before the drain-source voltage vds of the power transistor DMNL reaches the breakdown voltage Bvds, the detection threshold voltage VDT (clamp voltage) is set to be within a voltage range lower than the characteristics 500 of the breakdown voltage Bvds. Consequently, as shown in FIG. 5, the overvoltage-related detection threshold voltage VDT (clamp voltage) is set to be higher than the absolute maximum rated voltage Avds between the drain and source of the power transistor DMNL and lower than the breakdown voltage Bvds between the drain and source of the power transistor DMNL. As the overvoltage-related detection threshold voltage VDT is determined mainly by the clamp voltage of the clamp circuit 144, the detection threshold voltage VDT can be adjusted by adjusting the number of stages formed by the zener diodes ZD1-ZD4 in the clamp circuit 144.

The gate voltage monitoring circuit 143 monitors the gate voltage of the power transistor DMNL at the output stage and adjusts the clamp voltage of the clamp circuit 144 in accordance with the magnitude of the gate voltage. More specifically, when the gate voltage of the power transistor DMNL at the output stage (the voltage between the signal line L_LG and the signal line L_LS) exceeds a predefined gate detection threshold voltage VGT, the gate voltage monitoring circuit 143 turns on the transistor DMP1 in the clamp circuit 144 and makes adjustments to decrease the clamp voltage. The gate voltage monitoring circuit 143 includes, for example, a transistor DMN1, a threshold value adjustment circuit 146, and a resistive element R3. One end of the threshold value adjustment circuit 146 is coupled to a source of the transistor DMN1 and the other end is coupled to the signal line L_LS (ground node). One end of the resistive element R3 is coupled to the signal line L_LD (a source of the transistor DMP1) and the other end is coupled to a drain of the transistor DMN1 and to a gate of the transistor DMP1. A gate of the transistor DMN1 is coupled to the signal line L_LG.

The threshold value adjustment circuit 146 includes, for example, a resistive element R2 and diodes D1, D2. The resistive element R2 is series-coupled to the diodes D1, D2. When the gate voltage of the power transistor DMNL increases to turn on the transistor DMN1, a current flows to the resistive element R3 to cause a voltage drop across the resistive element R3, thereby turning on the transistor DMP1 in the clamp circuit 144. Control is then exercised to decrease the clamp voltage. The gate detection threshold voltage VGT for switching the clamp voltage is determined by a threshold voltage Vth of the transistor DMN1 and by a voltage across the threshold value adjustment circuit 146. The threshold value adjustment circuit 146 can easily set the gate detection threshold voltage VGT to a desired value by adjusting the resistance value of the resistive element R3 and the number of stages formed by the diodes D1, D2.

The transistor DMN1 is not particularly limited, but is the same type of transistor as the power transistor DMNL at the output stage. For example, the transistor DMN1 is an n-type DMOS transistor. This ensures that the characteristics of the power transistor DMNL are similar to those of the transistor DMN1 in terms, for instance, of variations and temperature changes. Hence, the gate detection threshold voltage VGT can be adjusted with ease.

As the above-described circuit configuration is employed, the low-side driver circuit 14 operates as described below. For example, in a normal state in which a voltage higher than the absolute maximum rated voltage of the squib driver circuit 10 is not applied to the terminal LDD, the detection signal SD of the overvoltage detection circuit 142 is not activated so that the switch elements SW1, SW2 of the gate drive circuit 141 are on. This causes the gate drive circuit 141 to supply a gate drive voltage according to the control signal SL to the gate terminal of the power transistor DMNL and control the on/off operation of the power transistor DMNL.

Meanwhile, when, as shown in FIG. 3, induced current noise Inp is applied in such a direction as to input the induced current noise Inp to a drain (terminal LDD) of the low-side driver circuit 14, the low-side driver circuit 14 operates as described below.

Figure 6:
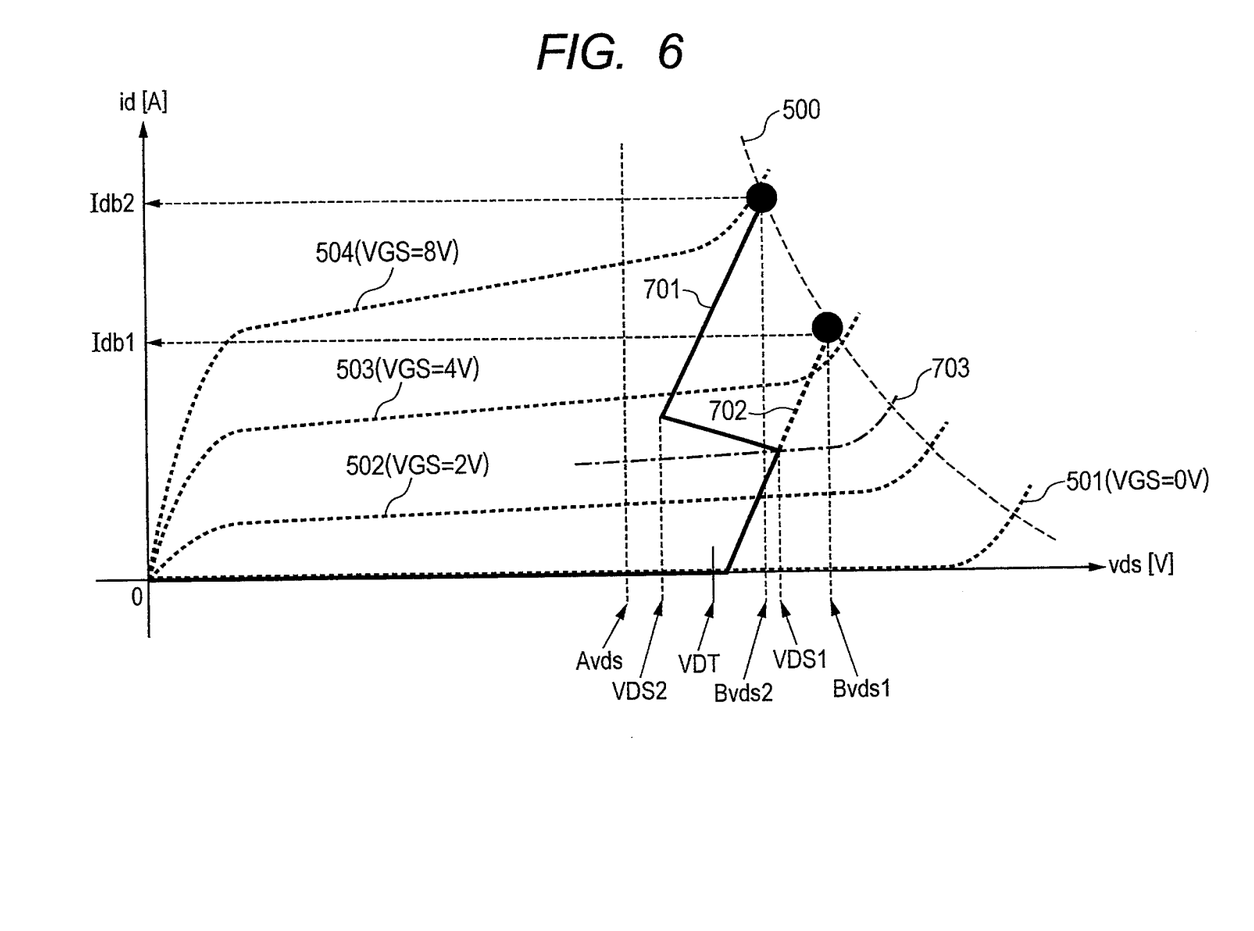
FIG. 6 is a diagram illustrating operating load curves prevailing during an active clamp operation of the low-side driver circuit.

FIG. 6 is a diagram illustrating operating load curves prevailing during the active clamp operation of the low-side driver circuit 14. As is the case with FIG. 5, FIG. 6 shows Id-Vds characteristics 501-504 prevailing at various gate-source voltages VGS of the power transistor DMNL, the characteristics 500 of the breakdown voltage Bvds between the drain and source of the power transistor DMNL, the absolute maximum rated voltage Avds between the drain and source of the power transistor DMNL, and the overvoltage-related detection threshold voltage VDT. FIG. 6 also illustrates an operating load curve 701 prevailing during the active clamp operation of the low-side driver circuit 14 and characteristics 703 of the gate detection threshold voltage VGT used by the gate voltage monitoring circuit 143. FIG. 6 further illustrates an operating load curve 702, which prevails when the clamp voltage remains unchanged during the active clamp operation, as an example to be compared to the operating load curve 701.

As shown in FIG. 6, if induced current noise is generated in such a direction as to input the induced current noise to the terminal LDD, the drain-source voltage vds of the power transistor DMNL (the voltage at the terminal LDD) increases. Within a range within which the drain-source voltage vds does not exceed the detection threshold voltage VDT for overvoltage detection, the gate drive circuit 141 controls the on/off operation of the power transistor DMNL in the same manner as in the above-described normal state. If, for instance, the signal level of the control signal SL is high, the transistor MN1 is on so that control is exercised to set the gate-source voltage VGS of the power transistor DMNL to 0 V. This ensures that the power transistor DMNL remains statically off. The external protection devices coupled to the terminal LDD then absorb the induced current noise to prevent a malfunction.

When the induced current noise increases, the drain-source voltage vds of the power transistor DMNL further increases. When the drain-source voltage vds exceeds the detection threshold voltage VDT, an overvoltage is detected. When the overvoltage is detected, the output of the gate drive circuit 141 is placed in a high-impedance state so that a current flows to the resistive element R1 through the series-coupled zener diodes ZD1-ZD5 in the clamp circuit 144. This increases the gate-source voltage VGS of the power transistor DMNL. When the gate-source voltage VGS exceeds a threshold voltage Vth of the power transistor DMNL, the power transistor DMNL allows a current to flow, thereby initiating the active clamp operation. In this instance, a feedback loop is formed between the clamp circuit 144, the resistive element R1, and the power transistor DMNL. Therefore, the drain-source voltage vds of the power transistor DMNL is determined by the clamp voltage of the clamp circuit 144, the resistance value of the resistive element R1, and the gate-source voltage VGS of the power transistor DMNL. Thus, the drain-source voltage vds of the power transistor DMNL increases with an increase in the induced current Inp (drain current id). Subsequently, when the induced current noise further increases to increase the drain-source voltage vds, the gate voltage VGS further increases through the clamp circuit 144 as well. If, as shown in FIG. 6, the gate-source voltage VGS exceeds the gate detection threshold voltage VGT (characteristics 703 in FIG. 6) when the drain-source voltage vds reaches a voltage VDS1, the gate voltage monitoring circuit 143 turns on the transistor DMP1 and switches the clamp voltage of the clamp circuit 144 from VCLMP1 to VCLMP2. This decreases the drain-gate voltage of the power transistor DMNL and further increases the gate voltage VGS. In other words, the power transistor DMNL switches to a biased state in which a larger drain current id can flow. The drain-source voltage vds of the power transistor DMNL then decreases, for example, from the voltage VDS1 to a voltage VDS2 as shown in FIG. 6. Subsequently, the drain current id and the drain-source voltage vds increase with an increase in the induced current Inp. When the drain current id increases to a current idb2 and the drain-source voltage vds reaches a breakdown voltage Bvds2, the power transistor DMNL breaks down. As shown in FIG. 6, the clamp voltage VCLMP2 is set in such a manner that the drain-source voltage VDS2 prevailing after clamp voltage switching is higher than the absolute maximum rated voltage Avds of the power transistor DMNL. This makes it possible to not only assure the operation of the squib driver circuit 10 at a voltage not higher than the absolute maximum rated voltage, but also increase the current absorption capacity during the active clamp operation.

On the other hand, when the low-side driver circuit has a related-art configuration in which the clamp voltage does not change during the active clamp operation, the operating load curve is as indicated by the reference numeral 702 in FIG. 6. More specifically, the active clamp operation increases the drain current id and the drain-source voltage vds after an overvoltage condition of the drain-source voltage vds is detected. However, the clamp voltage does not change during such an increase. Therefore, the gate-source voltage VGS of the power transistor DMNL does not significantly change but slightly increases due to feedback loop control. As a result, the drain current id and the drain-source voltage vds increase without decreasing the drain-source voltage vds. Consequently, the drain current that flows in the power transistor is not larger than "idb1", which is smaller than "idb2". Thus, a breakdown occurs when the drain-source voltage vds reaches a breakdown voltage Bvds1.

As described above, the low-side driver circuit 14 according to the present embodiment can implement enhanced noise immunity because it can cause the flow of a larger current (idb2) due to the active clamp operation than a related-art low-side driver circuit that does not change the clamp voltage during the active clamp operation. Further, an increase in the area of a chip can be suppressed because the transistor size of the power transistor DMNL is not increased in order to increase the current capacity of the power transistor DMNL during the active clamp operation. Furthermore, as the low-side driver circuit 14 can increase its own current noise absorption capacity, it is possible to reduce the sizes of the external protection devices (Cext2, Zext2, etc.) to be coupled, for instance, to the terminal LDD. This also makes it possible to reduce the number of external protection devices. Consequently, the low-side driver circuit 14 according to the present embodiment can provide enhanced noise immunity while suppressing a cost increase.

Second Embodiment

A second embodiment of the present invention will now be described in conjunction with an application example in which the circuit configuration of the output stage of the above-described low-side driver circuit 14 is applied to the ESD protection circuit.

Figure 7:
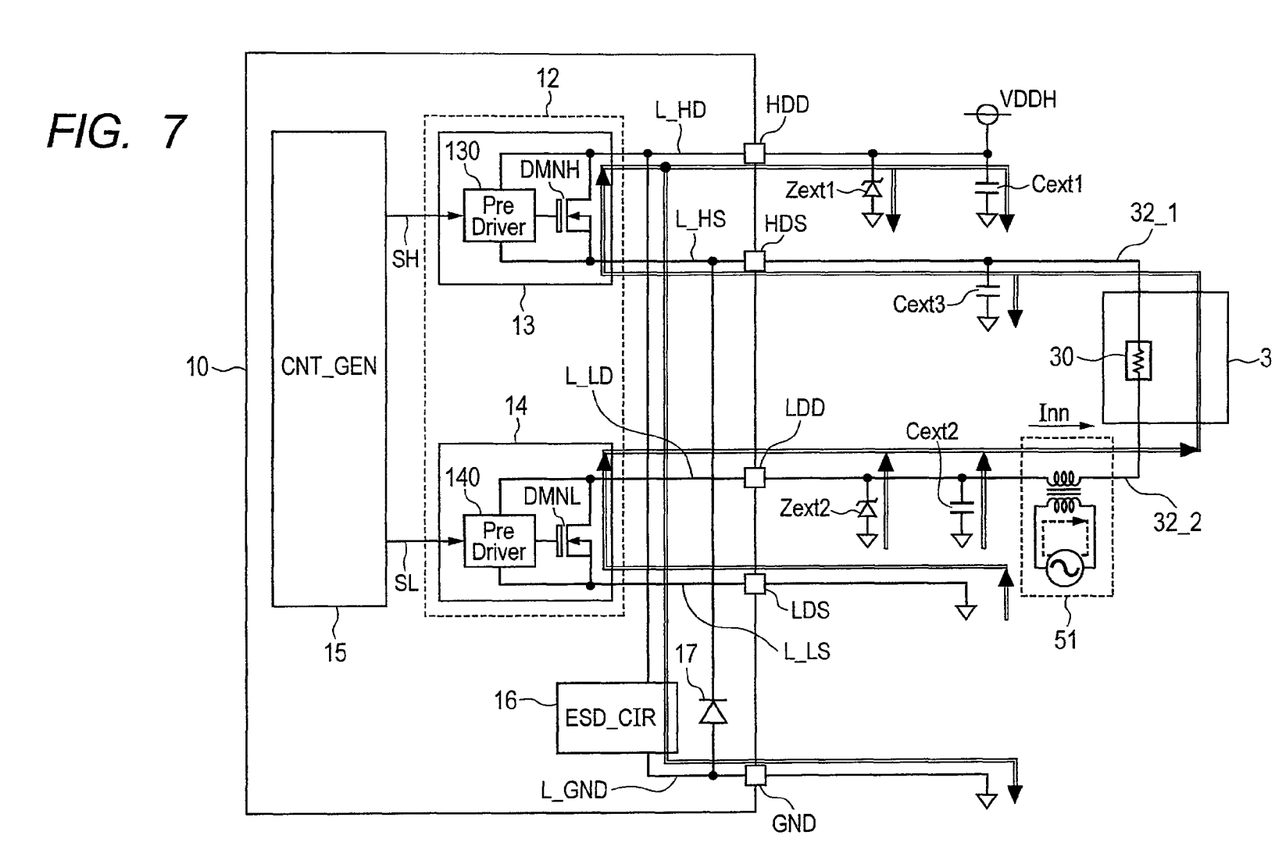
FIG. 7 is a diagram illustrating a current path that is followed when opposite-polarity induced current noise is applied.

FIG. 7 is a diagram illustrating a current path that is followed when opposite-polarity induced current noise is applied. FIG. 7 illustrates a case where an induced current Inn whose polarity is opposite to that of the induced current shown in FIG. 3 is applied to the terminal LDD, which is an output terminal of the low-side driver circuit 14. Further, FIG. 7 schematically shows a noise source 51 that acts as a mechanism for generating the induced current Inn, which is caused by the mutual inductance between harnesses.

As shown in FIG. 7, when negative induced noise is applied to the terminal LDD, a current supplied from the grounded terminal LDS through a parasitic diode of the power transistor DMNL in the low-side driver circuit 14 is combined with a current supplied from the external protection devices (external capacitor Cext2 and external zener diode Zext2). The resulting current Inn is then input into the squib 30. Part of the current Inn flowing through the squib 30 is absorbed by the external protection device (external capacitor Cext3), whereas the remaining current is input to the terminal HDS. The current input to the terminal HDS is supplied to the signal line L_HD through a parasitic diode of the power transistor DMNH in the high-side driver circuit 13. Part of the current is absorbed by the external protection devices (external capacitor Cext1 and external zener diode Zext1) through the terminal HDD, whereas the remaining current is absorbed by the ground node from the terminal GND through the ESD protection circuit 16. Enhanced ESD immunity can be provided when the circuit configuration of the output stage of the above-described low-side driver circuit 14 is applied to the ESD protection circuit 16.

Figure 8:
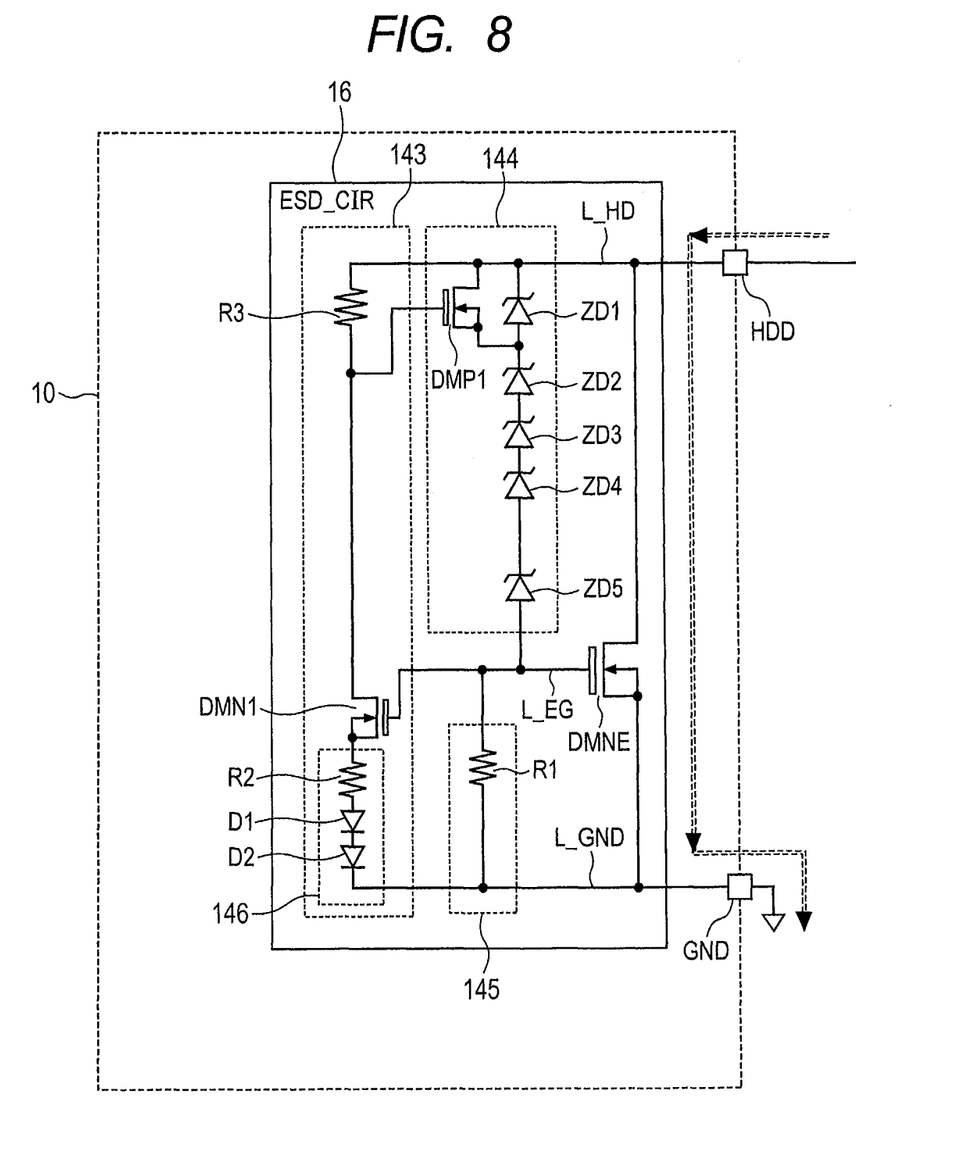
FIG. 8 is a circuit diagram illustrating the internal configuration of an ESD protection circuit.

FIG. 8 illustrates the circuit configuration of the ESD protection circuit. Elements identical with those of the low-side driver circuit 14 are designated by the same reference numerals and will not be redundantly described.

As shown in FIG. 8, the ESD protection circuit 16 has a circuit configuration from which, for example, the gate drive circuit 141 is removed from the above-described low-side driver circuit 14. More specifically, the ESD protection circuit 16 includes, for example, a power transistor DMNE, the gate voltage monitoring circuit 143, the clamp circuit 144, and the pull-down circuit 145. As is the case with the power transistor DMNL in the low-side driver circuit 14, the power transistor DMNE is an n-type DMOS transistor. Its drain is coupled to the signal line L_HD, its source is coupled to a signal line L_GND, and its gate is coupled to a signal line L_EG. A voltage (a voltage between the terminal HDD and the terminal GND) at which the power transistor DMNE begins to cause the flow of a current is mainly determined by the zener voltage of the zener diodes ZD1-ZD5 in the clamp circuit 144, as is the case with the low-side driver circuit 14. Although FIG. 8 illustrates the zener diodes ZD1-ZD5 in the clamp circuit 144, the number of stages provided by the zener diodes is not particularly limited, but is adjustable in accordance with required clamp voltage.

The ESD protection circuit 16 operates as described below. When, for instance, a voltage is applied between the terminal HDD and the terminal GND and the applied voltage exceeds the zener voltage of the zener diodes ZD1-ZD5 in the clamp circuit 144, a current begins to flow to the resistive element R1 through the clamp circuit 144, thereby increasing the gate voltage of the power transistor DMNE. When the gate-source voltage exceeds the threshold voltage Vth of the power transistor DMNE, a current flows to the power transistor DMNE so that the current supplied to the terminal HDD is absorbed. Subsequently, when the voltage between the terminal HDD and the terminal GND increases so that the gate voltage exceeds the gate detection threshold voltage VGT, the gate voltage monitoring circuit 143 turns on the transistor DMP1 and decreases the clamp voltage of the clamp circuit 144. This enables the power transistor DMNE to cause the flow of a larger drain current id, as is the case with the low-side driver circuit 14.

The ESD protection circuit 16 according to the second embodiment, which has been described above, eliminates the necessity of increasing the transistor size of the power transistor DMNE in order to provide enhanced ESD immunity. Therefore, enhanced ESD immunity can be provided while suppressing an increase in the cost of a chip.

Third Embodiment

Figure 9:
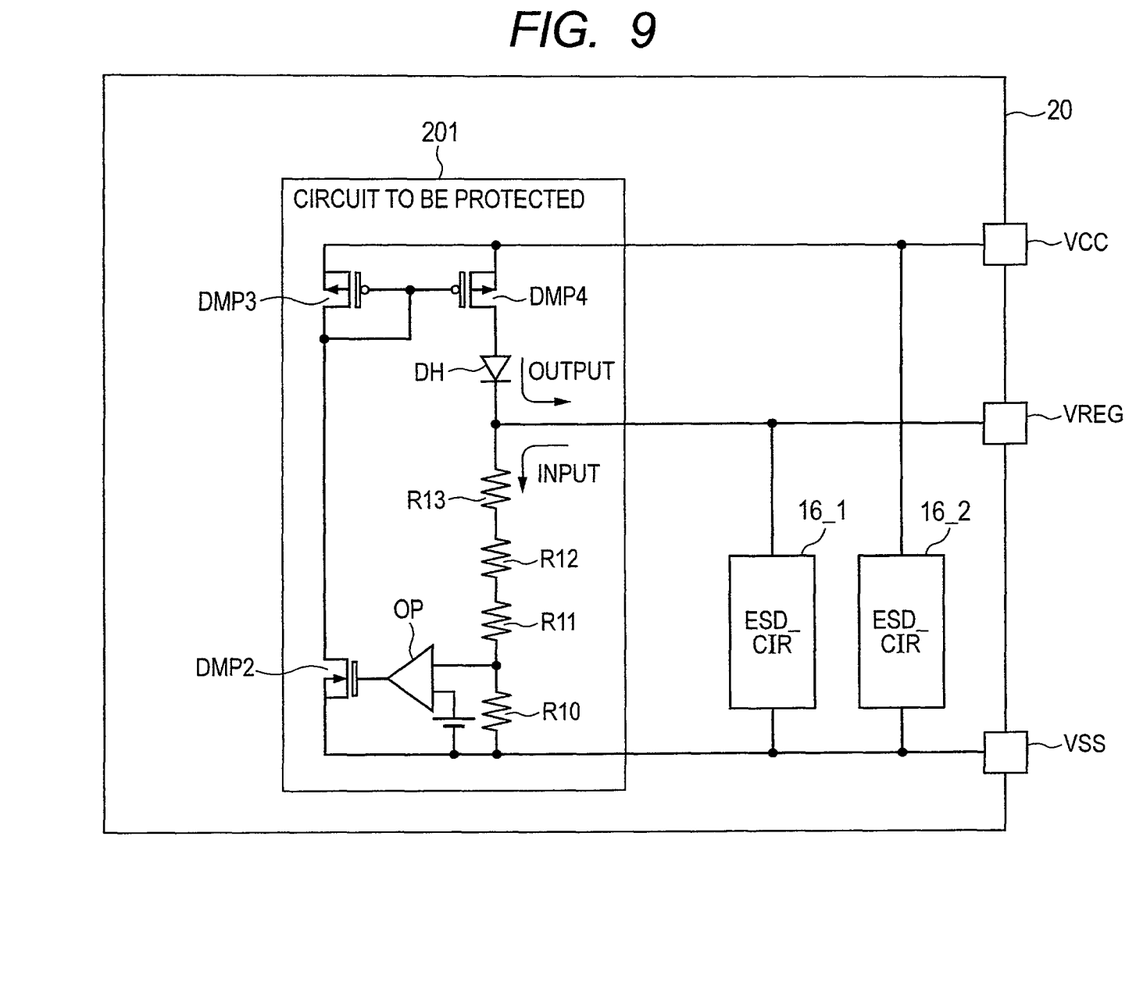
FIG. 9 is a diagram illustrating a semiconductor device having a regulator circuit that generates a voltage from a high-voltage power supply.

A third embodiment of the present invention will now be described with reference to FIG. 9. FIG. 9 illustrates a semiconductor device having a regulator circuit for generating a voltage from a high-voltage power supply, as another exemplary application of the above-described ESD protection circuit 16.

The semiconductor device 20 shown in FIG. 9 includes a regulator circuit 201, a power supply terminal VCC, a ground terminal VSS, an external terminal VREG, and ESD protection circuits (ESD_CIR) 16_1, 16_2. The regulator circuit 201 is a circuit to be protected. The power supply terminal VCC receives the supply of high-voltage power. The ground terminal VSS receives the supply of ground potential. The external terminal VREG outputs a voltage generated by the regulator circuit 201.

The regulator circuit 201 operates when it receives power supplied to the power supply terminal VCC. The regulator circuit 201 generates a regulated voltage by dividing a voltage at the external terminal VREG with voltage divider resistors R10-R13, conducting a monitoring operation with an operational amplifier OP, and exercising feedback control. Therefore, the external terminal VREG is not only an output terminal for outputting the regulated voltage, but also an input terminal for monitoring the output voltage. An inversely biased, high-voltage diode DH is coupled to a signal path coupled to the external terminal VREG of the regulator circuit 201. This prevents any reverse current flow to a power supply when a positive surge occurs at the external terminal VREG. Further, an input to the operational amplifier OP is protected by dividing it with the voltage divider resistors R10-R13. This ensures that the input to the operational amplifier OP can be configured by a CMOS element instead of a high-voltage DMOS. Furthermore, the regulator circuit 201 is protected against surge-induced breakdown when p-type transistors DMP3, DMP4 and an n-type transistor DMN2 are configured by a high-voltage element (DMOS) that withstands a voltage higher than the clamp voltage of the ESD protection circuits 161, 162.

The ESD protection circuit 16_1 is coupled between the external terminal VREG and the ground terminal VSS. The ESD protection circuit 16_2 is coupled between the power supply terminal VCC and the ground terminal VSS. The ESD protection circuits 16_1, 16_2 have the same circuit configuration as the earlier-described ESD protection circuit 16 shown in FIG. 8. For example, circuit constants of the ESD protection circuits 16_1, 16_2 are adjusted as needed. This enables the ESD protection circuits 16_1, 16_2 to cause the flow of a larger current than a related-art ESD protection circuit. As a result, the ESD immunity of the semiconductor device 20 can be enhanced.

As is the case with the semiconductor device according to the second embodiment, the semiconductor device 20 according to the third embodiment can provide enhanced ESD immunity while suppressing an increase in the cost of a chip.

While the present invention contemplated by its inventors has been described in detail in terms of preferred embodiments, it is to be understood that the present invention is not limited to those preferred embodiments, but extends to various modifications that nevertheless fall within the spirit and scope of the appended claims.

For example, the illustrated circuit configuration of the clamp circuit 144 is such that the zener diodes ZD1-ZD5 are series-coupled. However, the present invention is not limited to such a circuit configuration. An alternative circuit configuration may be employed as far as the path between the drain and gate of the power transistor DMNL can be clamped. For example, an alternative is to employ a circuit configuration in which PN diodes are series-coupled or a circuit configuration in which a PN diode is coupled as needed to series-coupled zener diodes in order to fine-tune the clamp voltage.

Further, the first to third embodiments have been described on the assumption that the clamp voltage is changed once in accordance with an increase in the gate voltage of the power transistor DMNL. However, the present invention is not limited to the use of such a method. The clamp voltage may be changed a plurality of number of times. For example, an additional transistor may be coupled across the zener diode ZD2 in the clamp circuit 144. When the gate voltage increases and then further increases after the transistor DMP1 is turned on, the transistor coupled across the zener diode ZD2 may be turned on. This makes it possible to cause the flow of a larger current during the active clamp operation. In this instance, the clamp voltage prevailing after a second change needs to be higher than the absolute maximum rated voltage Avds in order to assure the operation of the squib driver circuit 10 at a voltage not higher than the absolute maximum rated voltage.

Furthermore, the third embodiment has been described on the assumption that the ESD protection circuit 16_1 is used as an ESD element coupled between the ground terminal VSS and the external terminal VREG, which is used to output a signal. However, the present invention is not limited to the use of such a configuration. Alternatively, the ESD protection circuit 16_1 may be used as an ESD element coupled between the ground terminal and an input terminal, which is used to input a signal.

Moreover, the first to third embodiments have been described on the assumption that the power transistor DMNL is a DMOS. However, the power transistor DMNL is not particularly limited as far as it is a high-voltage power transistor such as an IGBT (Insulated Gate Bipolar Transistor) or a MOS transistor having a super-junction structure.

What is claimed is:

1. A semiconductor device comprising:
a first signal line coupled to a first external terminal;
a second signal line coupled to a second external terminal;
a third signal line;
a power transistor disposed between the first signal line and the second signal line, a gate electrode of the power transistor being coupled to the third signal line;
a clamp circuit disposed between the first signal line and the third signal line to clamp a voltage between the first signal line and the third signal line;
a first resistive element disposed between the third signal line and the second signal line; and
a monitoring section that monitors a gate voltage of the power transistor,
wherein the clamp circuit is configured so to change a clamp voltage,
wherein the monitoring section decreases the clamp voltage of the clamp circuit when the gate voltage exceeds a predefined threshold value,
wherein the clamp circuit includes a plurality of series-coupled diodes, the monitoring section decreases the clamp voltage of the clamp circuit by forming a current path in parallel with one or more of the diodes,
wherein the clamp circuit further includes a switch element coupled across the one or more of the diodes, and the monitoring section forms the current path by turning on the switch element,
wherein the monitoring section includes a first transistor having a gate electrode coupled to the third signal line, a voltage generation section that is coupled at one end to a source electrode of the first transistor and coupled at the other end to the second signal line to generate a voltage across both ends thereof in accordance with an input current, and a load element, one end of which is disposed between a drain electrode of the first transistor and the first signal line, and
wherein an on/off operation of the switch element is controlled in accordance with the potential difference across the load element.

2. The semiconductor device according to claim 1, wherein the one or more of the diodes include a Zener diode.

3. The semiconductor device according to claim 1, wherein the power transistor and the first transistor are the same type of transistor.

4. The semiconductor device according to claim 1, wherein the power transistor is a DMOS transistor.

5. The semiconductor device according to claim 1, further comprising:
a control section that generates the control signal in accordance with a signal input from the outside.

6. The semiconductor device according to claim 1,
wherein the first external terminal is a power supply terminal that receives the supply of a first power supply voltage, and
wherein the second external terminal is a power supply terminal that receives the supply of a second power supply voltage, which is lower than the first power supply voltage.

7. The semiconductor device according to claim 1,
wherein the first external terminal is a signal terminal that inputs or outputs a signal, and
wherein the second external terminal is a power supply terminal that receives the supply of a power supply voltage, which is lower than a voltage supplied to the signal terminal.

8. A semiconductor device comprising:

a first signal line coupled to a first external terminal;
a second signal line coupled to a second external terminal;
a third signal line;
a power transistor disposed between the first signal line and the second signal line, a gate electrode of the power transistor being coupled to the third signal line;
a clamp circuit disposed between the first signal line and the third signal line to clamp a voltage between the first signal line and the third signal line;
a first resistive element disposed between the third signal line and the second signal line;
a monitoring section that monitors a gate voltage of the power transistor; and
a drive voltage generation section that outputs a drive voltage for driving the power transistor to the third signal line in accordance with a control signal for specifying whether to turn on or off the power transistor,
wherein the clamp circuit is configured to change a clamp voltage,
wherein the monitoring section decreases the clamp voltage of the clamp circuit when the gate voltage exceeds a predefined threshold value,
wherein the clamp circuit includes a plurality of series-coupled diodes, and the monitoring section decreases the clamp voltage of the clamp circuit by forming a current path in parallel with one or more of the diodes,
wherein the monitoring section exercises control to decrease the clamp voltage of the clamp circuit by switching the clamp voltage from a first voltage to a second voltage, which is lower than the first voltage,
wherein the second voltage is adjusted so that the voltage developed between the first signal line and the second signal line after switching is higher than the absolute maximum rating of the power transistor,
wherein the semiconductor device further comprises an overvoltage detection section that activates a detection signal when the voltage between the first signal line and the second signal line is found to be higher than a predetermined voltage, and
wherein when the detection signal is activated, the drive voltage generation section stops the output of the drive voltage.

9. The semiconductor device according to claim 8, wherein the one or more of the diodes include a Zener diode.

10. The semiconductor device according to claim 8, wherein the power transistor is a DMOS transistor.

11. The semiconductor device according to claim 8,
wherein the first external terminal is a power supply terminal that receives the supply of a first power supply voltage, and
wherein the second external terminal is a power supply terminal that receives the supply of a second power supply voltage, which is lower than the first power supply voltage.

12. The semiconductor device according to claim 8,
wherein the first external terminal is a signal terminal that inputs or outputs a signal, and
wherein the second external terminal is a power supply terminal that receives the supply of a power supply voltage, which is lower than a voltage supplied to the signal terminal.

13. The semiconductor device according to claim 8, further comprising:
a control section that generates the control signal in accordance with a signal input from the outside.

14. The semiconductor device according to claim 8, wherein the power transistor and the first transistor are the same type of transistor.

* * * * *